US012723303B2

(12) United States Patent
Antonio et al.

(10) Patent No.: US 12,723,303 B2
(45) Date of Patent: Sep. 1, 2026

(54) CHAMBER PORT ASSEMBLY

(71) Applicant: Applied Materials, Inc., Santa Clara, CA (US)

(72) Inventors: Ralph P. Antonio, Santa Clara, CA (US); Daisuke Tanaka, Los Gatos, CA (US); Peter Lai, Santa Clara, CA (US); Kaushik Rao, Santa Clara, CA (US); Sudhir R. Gondhalekar, Fremont, CA (US); Paul Emerick, Richmond, CA (US)

(73) Assignee: Applied Materials Inc., Santa Clara, CA (US)

( * ) Notice: Subject to any disclaimer, the term of this patent is extended or adjusted under 35 U.S.C. 154(b) by 63 days.

(21) Appl. No.: 18/431,332

(22) Filed: Feb. 2, 2024

(65) Prior Publication Data

US 2025/0250665 A1 Aug. 7, 2025

(51) Int. Cl.
*C23C 14/54* (2006.01)
*C23C 16/52* (2006.01)

(52) U.S. Cl.
CPC .............. *C23C 14/54* (2013.01); *C23C 16/52* (2013.01)

(58) Field of Classification Search
CPC ................................ C23C 14/54; C23C 16/52
See application file for complete search history.

(56) References Cited

U.S. PATENT DOCUMENTS 5,746,434 A 5/1998 Boyd et al.
9,435,025 B2 9/2016 Madiwal et al.
10,090,174 B2 10/2018 Wongsenakhum et al.
10,161,035 B2 12/2018 Rocha-Alvarez et al.
2002/0009813 A1 1/2002 Deguchi
2003/0159780 A1 8/2003 Carpenter et al.
2010/0111648 A1* 5/2010 Tamura ............. H01L 21/67248 414/217
2010/0211203 A1 8/2010 Oka et al.
2014/0262751 A1* 9/2014 Burrows ........... H01J 37/32972 204/298.03
2017/0092518 A1 3/2017 Takano
2019/0062947 A1* 2/2019 Savas ................ H01L 21/68707
2021/0305028 A1* 9/2021 Guo .................. H01J 37/32825
2022/0122819 A1* 4/2022 Tong ..................... C23C 16/452
2022/0310360 A1* 9/2022 Rathi .................... C23C 16/452
2023/0287566 A1 9/2023 Moos et al.

OTHER PUBLICATIONS

International Search Report for PCT/US25/013020, dated May 14, 2025.

* cited by examiner

*Primary Examiner* — Patrick S Ott
(74) *Attorney, Agent, or Firm* — Moser Taboada

(57) ABSTRACT

Methods and apparatus for a substrate processing system includes a chamber port assembly configured to connect between respective first and second chambers of a substrate processing system. The chamber port assembly includes a body with openings disposed on opposing sides of the body and a tunnel extending between the openings to facilitate passage of a substrate between the first and second chambers through the tunnel; an inlet port in the body; a manifold in fluid communication with the inlet port and having an outlet in fluid communication with the tunnel; and a sensor port in the body in communication with the tunnel.

19 Claims, 5 Drawing Sheets

CHAMBER PORT ASSEMBLY

FIELD

Embodiments of the present disclosure generally relate to a port assembly and more particularly, to a chamber port assembly configured to connect between respective first and second chambers of a substrate processing system.

BACKGROUND

A chamber port assembly is a hardware interface between chambers, such as a process chamber and a transfer chamber of a substrate processing system. A slit valve door, which is often included with the chamber port assembly, opens and closes an opening in the chamber port assembly to permit movement of substrates between the chambers.

During processing, the slit valve door is closed so that interior surfaces of the slit valve door and some interior surfaces of the chamber port are exposed to process materials. Such process materials may form deposits on the slit valve door and the interior surfaces of the chamber port, which must eventually be cleaned in a cleaning process. Some cleaning processes may include opening the process chamber, removing components from the process chamber, and adding cleaning jigs to the process chamber. These steps may be performed in reverse after cleaning is complete. In addition, lengthy recalibration and recertification of the process chamber may also be needed before restarting substrate processing.

Also, some substrate processing systems may be configured to take measurements of the substrate outside of the substrate process chamber. For example, some substrate processing systems sample residual gases from process chambers in the foreline of the substrate processing system. However, such bulk measurements do not measure conditions at a specific location in a particular process chamber, which may result in inaccuracy and lag time in measurement.

Thus, a chamber port assembly is provided that can reduce chamber port cleaning time and improves measurement accuracy of conditions at the interface between process chambers.

SUMMARY

Methods and apparatus for a chamber port assembly configured to connect between respective first and second chambers of a substrate processing system are provided herein. In some embodiments, a chamber port assembly configured to connect between respective first and second chambers of a substrate processing system includes a body with openings disposed on opposing sides of the body and a tunnel extending between the openings to facilitate passage of a substrate between the first and second chambers through the tunnel; an inlet port in the body; a manifold in fluid communication with the inlet port and having an outlet in fluid communication with the tunnel; and a sensor port in the body in communication with the tunnel.

In some embodiments, a substrate processing system includes: a first chamber; a second chamber; and the chamber port assembly described above connected between the first and second chambers.

In some embodiments, a method for a substrate processing system includes: flowing a fluid through an inlet port in a body of a chamber port assembly configured to connect between a first and a second chamber of the substrate processing system, the chamber port assembly comprising a body with openings disposed on opposing sides of the body and a tunnel extending between the openings to facilitate passage of a substrate between the first and second chambers through the tunnel; distributing the fluid into the tunnel through a manifold connected to the inlet port, the manifold having an outlet in fluid communication with the tunnel; and sensing, through a sensor port in the body of the chamber port, at least one condition proximate the tunnel as the fluid is distributed into the tunnel.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
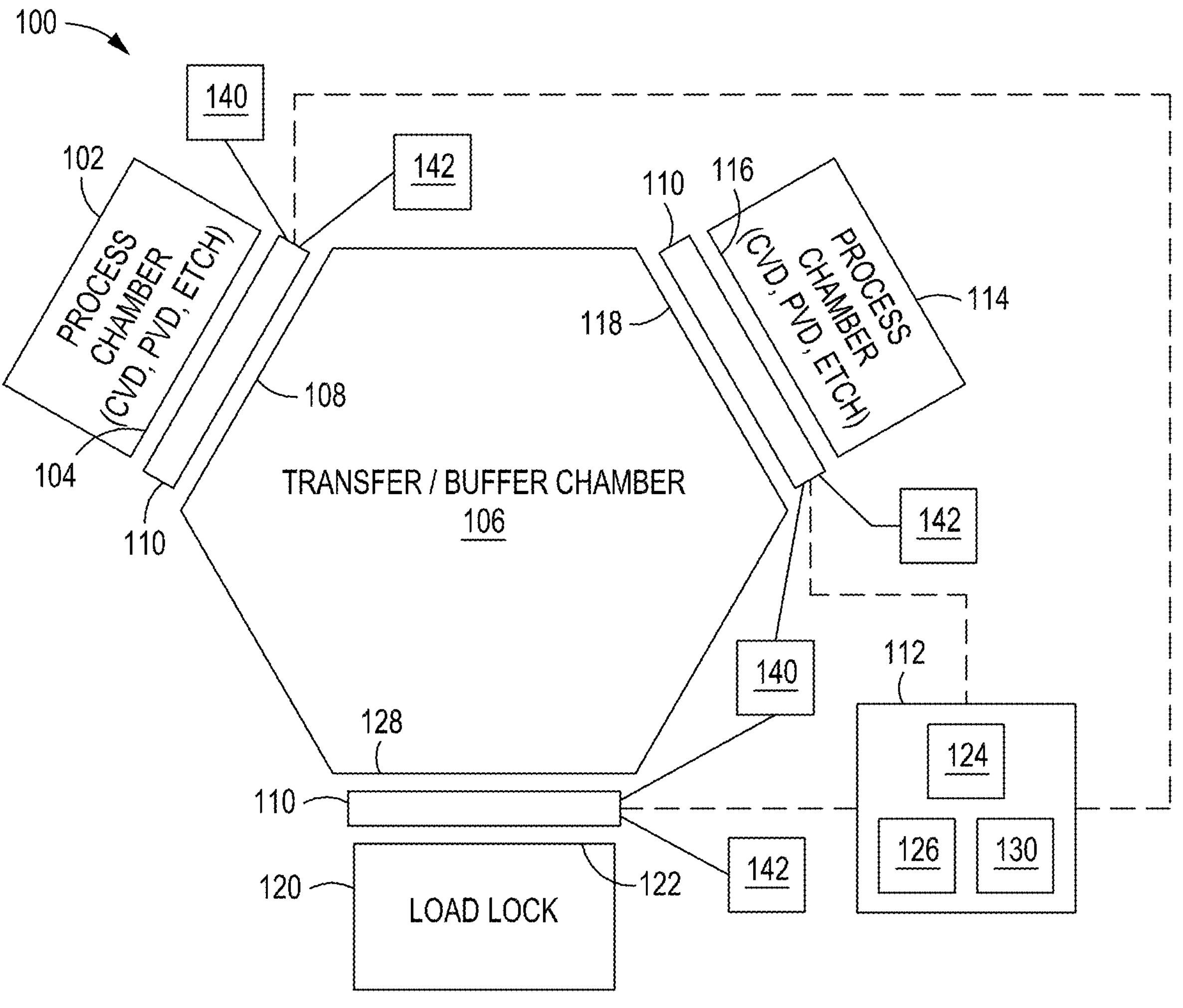
FIG. 1 is a schematic of a substrate processing system in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a substrate processing system and chamber port assembly are provided herein. In some embodiments, and as shown in FIG. 1, a substrate processing system 100 is shown that includes a first chamber 102 (e.g., physical vapor deposition (PVD), chemical vapor deposition (CVD), etch, load lock, or other substrate processing chamber) having a first opening 104 configured to receive a substrate, a second chamber 106 (e.g., transfer chamber) having a second opening 108 configured to receive the substrate, and a chamber port assembly 110 configured to connect between the first chamber 102 and the second chamber 106. In some embodiments, and as shown in FIG. 1, the substrate processing system may also include a third chamber 114 (e.g., physical vapor deposition (PVD), chemical vapor deposition (CVD), etch, load lock, or other substrate processing chamber) having a third opening 116 configured to receive a substrate. In some embodiments, and as shown in FIG. 1, the second chamber 106 may have a fourth opening 118 configured to receive the substrate from the third chamber 114 through another chamber port assembly 110 connected between the third chamber 114 and the second chamber 106.

In some embodiments, and as shown in FIG. 1, the substrate processing system 100 may include a fourth chamber 120 (e.g., physical vapor deposition (PVD), chemical vapor deposition (CVD), etch, load lock, or other substrate processing chamber) having a fifth opening 122 configured to receive a substrate. In some embodiments, and as shown in FIG. 1, the second chamber 106 may have a sixth opening 128 configured to receive the substrate from the fourth chamber 120 through another chamber port assembly 110 connected between the fourth chamber 120 and the second chamber 106.

In some embodiments, the substrate processing system 100 may be configured as a cluster tool where the first chamber 102 and the third chamber 114 are process chambers, second chamber 106 is a transfer/buffer chamber, and the fourth chamber 120 is a load lock chamber. To effectuate transport of a substrate amongst the first chamber 102, second chamber 106, third chamber 114, and fourth chamber 120, the second chamber 106 may contain a robotic transport mechanism (not shown). The transport mechanism may have a pair of substrate transport blades (not shown) attached to distal ends of a pair of extendible arms (not shown), respectively. The substrate transport blades may be used for carrying individual substrates to and from the first chamber 102 and third chamber 114. (i.e., the process chambers).

In operation, one of the substrate transport blades of the transport mechanism retrieves a substrate from a cassette (not shown) in the fourth chamber 120 (i.e., load lock chamber) and carries that substrate to a first stage of processing, for example, physical vapor deposition (PVD), in the first chamber 102. If the first chamber 102 is occupied, the robot waits and holds the substrate in the second chamber 106 (i.e., transfer/buffer chamber) until the processing is complete and then swaps substrates, i.e., removes the processed substrate from the first chamber 102 with one blade and inserts a new substrate with a second blade. Before blades perform a swap of substrates, a slit valve door in the respective chamber port assembly 110 must be opened to permit movement of the blades into and out of the first chamber 102 or third chamber 114.

Once the substrate is processed (i.e., PVD of material upon the substrate), the substrate can then be moved to a second stage of processing, and so on. For each move, the transport mechanism generally has one blade carrying a substrate and one blade empty to execute a substrate swap. The transport mechanism waits at each of the first chamber 102 and third chamber 114 (i.e., process chamber), until a swap can be accomplished.

Once processing is complete within the first chamber 102 and/or third chamber 114, the transport mechanism moves the substrate from the first chamber 102 or third chamber 114 (i.e., the last process chamber) and transports the substrate to a cassette (not shown) within the fourth chamber 120.

As described in greater detail herein, in some embodiments the chamber port assembly 110 may include one or more fluid ports and sensor ports that advantageously provide for fluid delivery and data collection proximate the chamber port assembly 110. As described in greater detail herein, the chamber port assembly 110 may enable substrate data collection in a vacuum environment between chambers of the substrate processing system 100.

In some embodiments, and as shown in FIG. 1, the substrate processing system 100 may include one or more remote plasma sources 140 connected to the chamber port assemblies 110. The remote plasma source 140 may be configured to generate plasma (e.g., $NF_3$ plasma), which may be used to clean the chamber port assembly 110 as described in greater detail herein. In some embodiments, the chamber port assembly 110 may enable delivery of cleaning plasma to the chamber port assembly 110 to clean off residue deposits in-situ without additional downtime for reconfiguration of the chambers of the substrate processing system or downtime for recalibration and recertification of chambers of the substrate processing system.

In some embodiments, and as shown in FIG. 1, the substrate processing system 100 may include one or more purge gas supplies 142 connected to the chamber port assemblies 110. The purge gas supplies 142 may be configured to supply a purge gas (e.g., $N_2$) to the chamber port assemblies 110 as described in greater detail herein. In some embodiments, as the substrate exits a process chamber and enters the chamber port assembly 110, inert purge gas can flow on top of the substrate to continuously purge and collect substrate data proximate the chamber port assembly 110.

Figure 2:
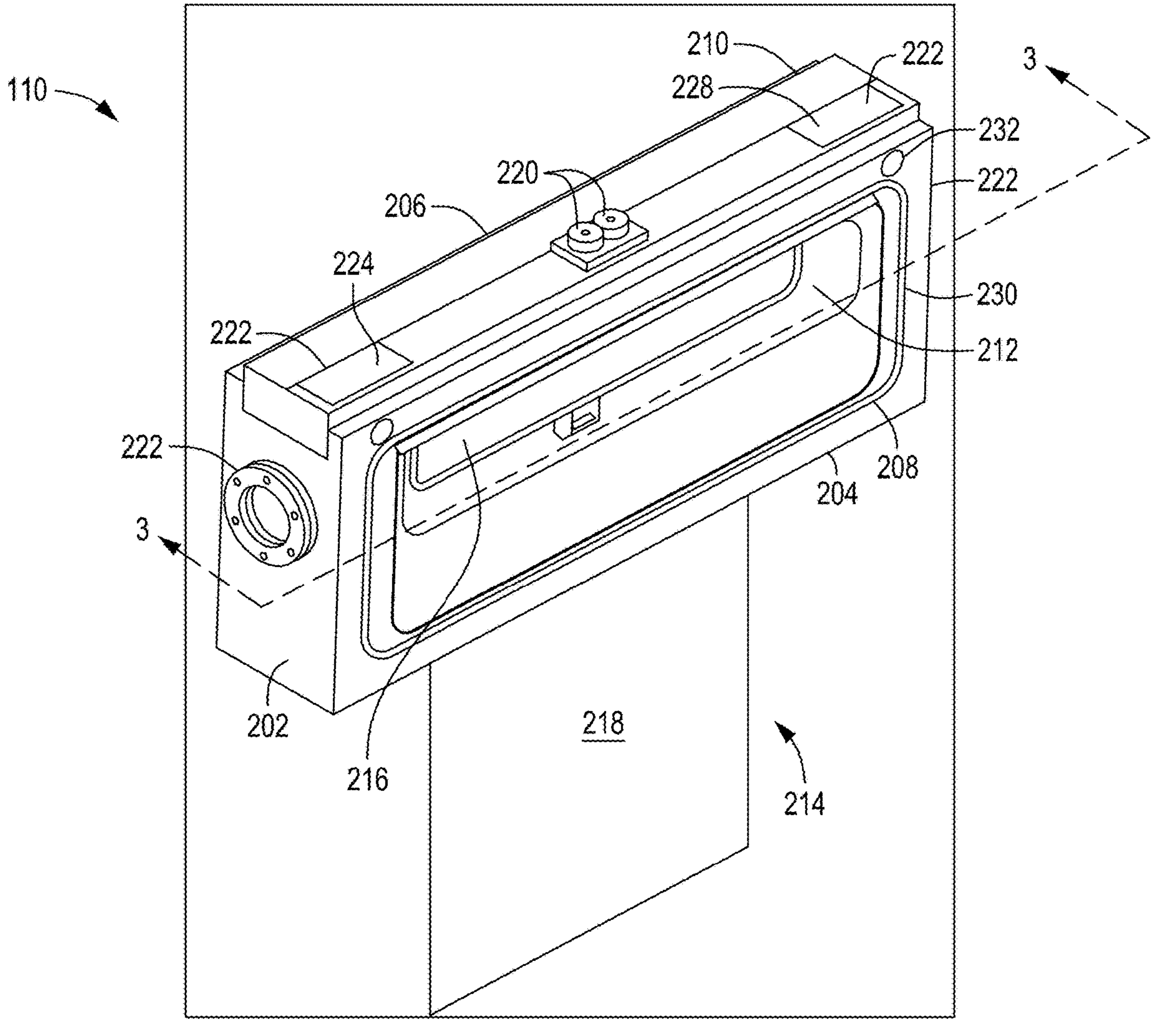
FIG. 2 shows a chamber port assembly in accordance with some embodiments of the present disclosure.

In some embodiments, and as shown in FIG. 2, the chamber port assembly 110 may comprise a body 202 with openings 204 and 206 disposed on opposing sides 208 and 210 of the body 202 and a tunnel 212 extending between the openings 204 and 206 to facilitate passage of a substrate between the first chamber 102 and the second chamber 106 through the tunnel 212. In some embodiments, the chamber port assembly 110 may be arranged so that the side 208 may connect to the first chamber 102 and the side 210 may connect to the second chamber 106.

Figure 5:
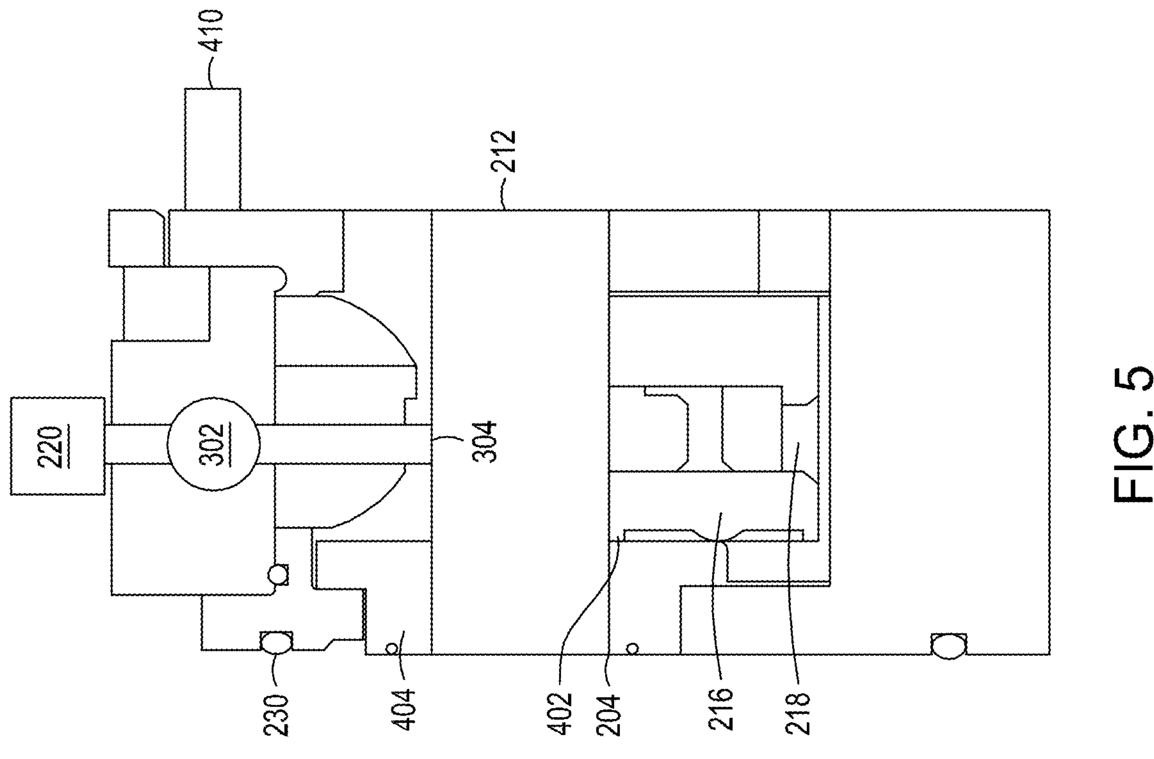
FIG. 5 shows the chamber port assembly of FIG. 2 along section 4-4 in FIG. 3 with the slit valve in an open position.
Figure 4:
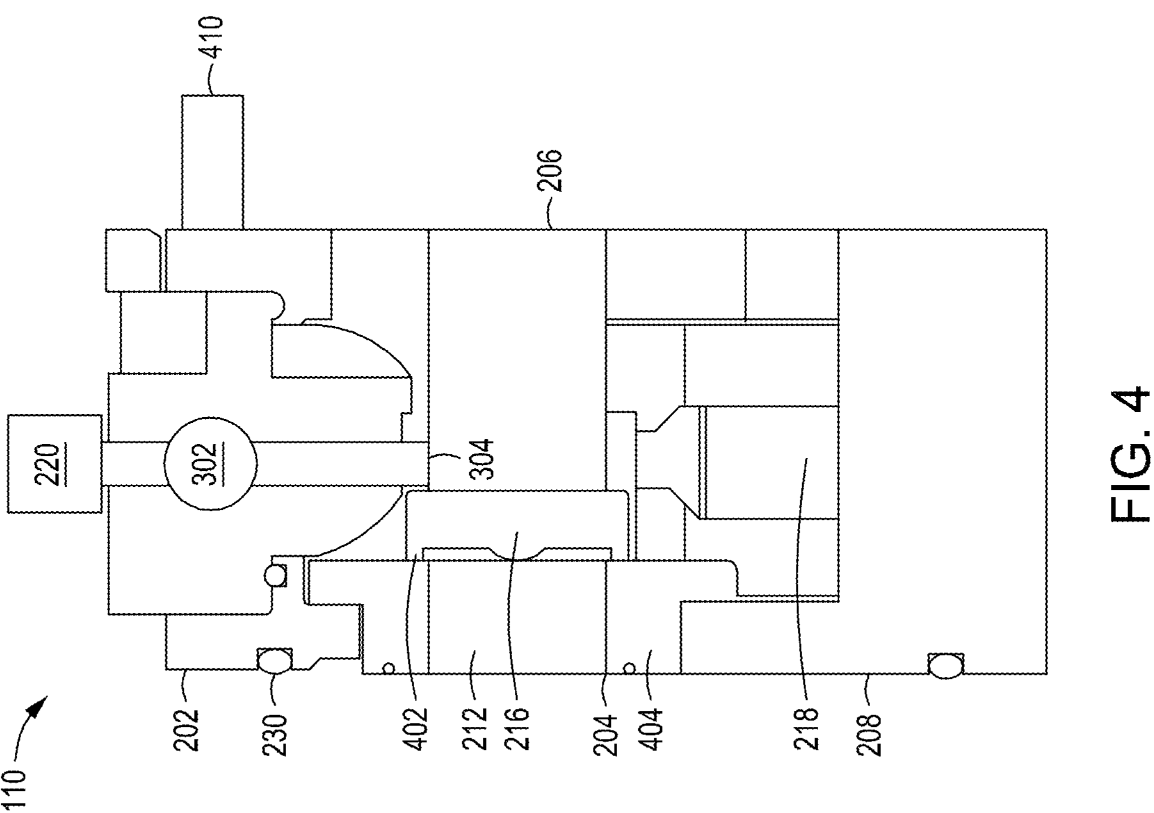
FIG. 4 shows the chamber port assembly of FIG. 2 along section 4-4 in FIG. 3 with a slit valve in a closed position.

In some embodiments, side 208 may connect to the first chamber 102 and side 210 may connect to the second chamber 106 with fasteners, such as threaded fasteners (e.g., bolts). In some embodiments, side 208 and side 210 may have at least one locating feature, such as a locating hole 232 or a locating pin 410 (FIGS. 4 and 5) that align with complementary features on the first chamber 102 and second chamber 106. In some embodiments, and as shown in FIGS. 2, 4, and 5, the side 208 may have a seal 230, such as o-ring seals, to seal the connection between the side 208 and the first chamber 102. In some embodiments, side 210 may have a seal 230 to seal the connection between side 210 and the second chamber 106. In some embodiments, the seal 230 may be configured to provide a seal for positive and negative pressure experienced during use of the substrate processing system 100.

In some embodiments, and as shown in FIG. 2, the chamber port assembly 110 may include a slit valve 214 coupled to the body 202. The slit valve 214 may be configured to selectively close the tunnel 212, such as during substrate processing in the first chamber 102. The slit valve 214 may include a slit valve door 216 and an actuator 218 configured to move the slit valve 214 between a closed position (shown in FIGS. 2-4) and an open position (shown in FIG. 5). The slit valve door 216 may have a seal 402 (FIG. 4) around a periphery of the slit valve door 216 to seal against a seat 404 along a periphery of the tunnel 212.

Figure 3:
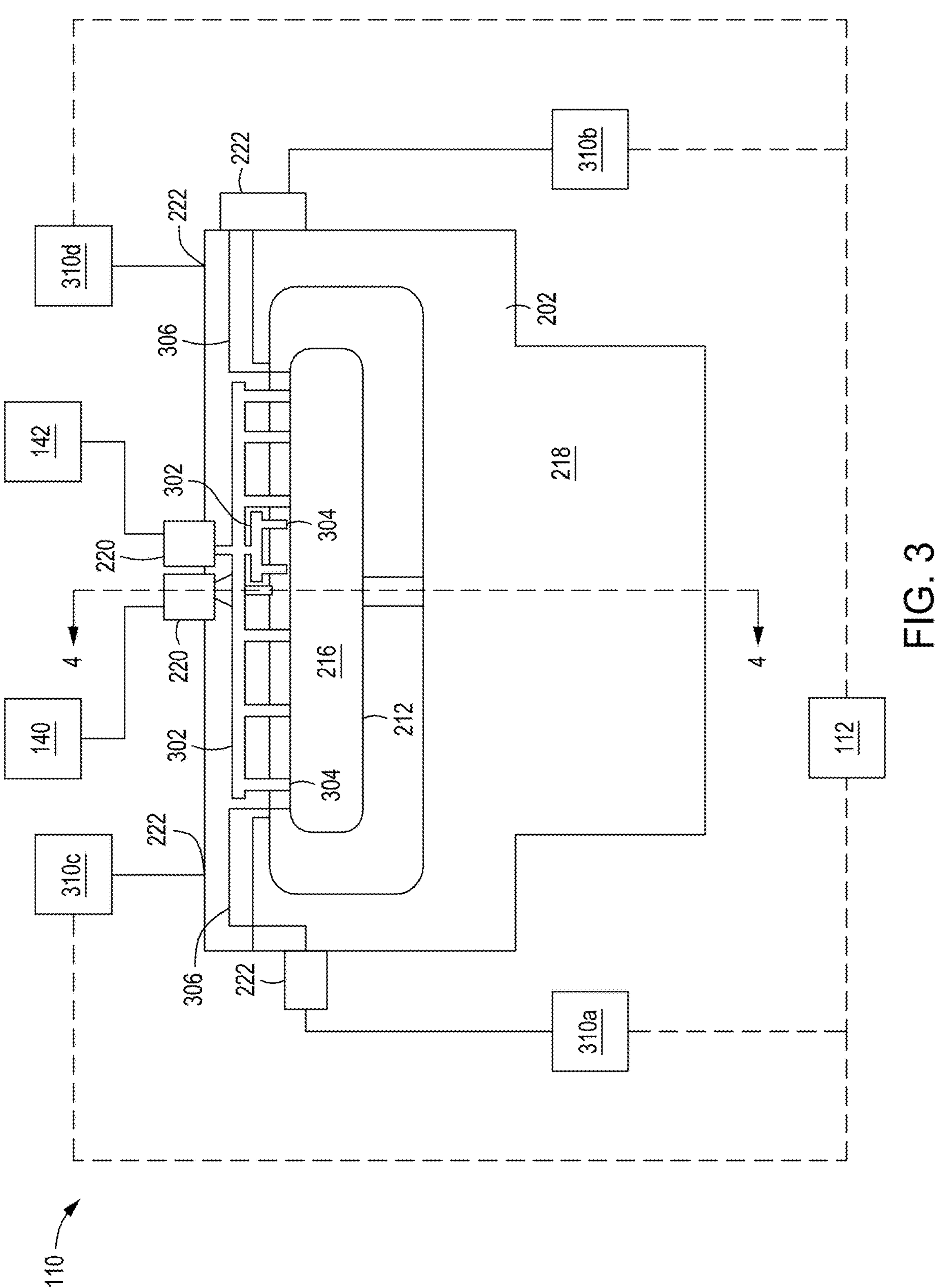
FIG. 3 shows the chamber port assembly of FIG. 2 along section 3-3 in FIG. 2.

In some embodiments, and as show in FIG. 2, the chamber port assembly 110 may include a plurality of independent inlet ports 220 in the body 202. As used herein "independent" means that the inlet ports 220 are not fluidly connected to each other. In some embodiments, one inlet port 220 may be connected to a cleaning fluid, such as $NF_3$ plasma, and another inlet port 220 may be connected to an inert purge fluid, such as nitrogen ($N_2$) gas. In some embodiments, and as shown in FIG. 3, the chamber port assembly 110 may include a plurality of independent manifolds 302. Each manifold 302 may be connected to a corresponding one of the plurality of independent inlet ports 220, and each manifold 302 may have one or more outlets 304 in fluid communication with the tunnel 212. In some embodiments, one inlet port 220 may be connected to the remote plasma source 140, which may generate and provide cleaning plasma (e.g., $NF_3$ plasma) to inlet port 220, which may flow through a manifold 302 connected to the corresponding inlet port 220 to be distributed through corresponding outlets 304 into the tunnel 212 where the cleaning plasma may clean surfaces of the chamber port assembly 110. In some embodiments, one inlet port 220 may be connected to the purge gas supply 142, which may provide purge gas to inlet port 220, which may flow through a manifold 302 connected to the corresponding inlet port 220 to be distributed through corresponding outlets 304 into the tunnel 212.

In some embodiments, and as shown in FIGS. 2 and 3, the chamber port assembly 110 may include one or more sensor ports 222 in the body 202 in communication with the tunnel 212. In some embodiments, one or more sensor ports 222 may be in fluid communication with the tunnel 212. In some embodiments, and as shown in FIG. 3, a fluid channel 306 may extend in the body 202 from the sensor ports 222 to the tunnel 212. In some embodiments, and as shown in FIG. 2, one or more sensor ports 222 may include a window 224 that may be optically coupled with the tunnel 212. In some embodiments, the window 224 may be include a transmissible material 228 that is configured to permit transmission of signals, such as IR and RF signals therethrough for use with sensors connected to the sensor port 222.

In some embodiments, and as shown in FIG. 3, the chamber port assembly 110, may include a sensor, such as any of sensors 310*a*, 310*b*, 310*c*, and 310*d* coupled to the sensor ports 222. In the embodiment shown in FIG. 3, sensor 310*a* is a particle detector coupled to one sensor port 222 and sensor 310*b* is a residual gas analyzer (RGA) coupled to another sensor port 222. In some embodiments, a mass spectrometer may be used in place of or in addition to the RGA. In some embodiments, and as shown in FIG. 3, sensor 310*c* is an image sensor (e.g., a camera, such as CCD camera) coupled to one sensor port 222 for sensing through the window 224 and sensor 310*d* is a temperature sensor (e.g., infra-red (IR) temperature sensor) coupled to another sensor port 222 for sensing through the transmissible material 228.

In some embodiments, one or more outlets 304 of the manifolds 302 may be configured to direct fluid towards one of the opposed openings 204 and 206. In some embodiments, a plurality of outlets 304 of a manifold 302 may be equally spaced from one another or the spacing may vary. In some embodiments, the unequal spacing of outlets 304 may be used to direct cleaning fluid, such as $NF_3$ plasma, to specific areas of the tunnel 212 and the slit valve 214 which may be prone to build-up of deposits.

The inlet ports 220 can be used to deliver fluids, such cleaning plasma or purge gas, to the tunnel 212. In some embodiments, a remote plasma source (not shown) may be connected to one inlet port 220 to allow a plasma, such as $NF_3$ or other cleaning plasma, to be delivered directly to the tunnel 212 of the chamber port assembly 110 to clean off deposits on surfaces of the chamber port assembly 110. By delivering cleaning fluid to the tunnel 212 through an inlet port 220 and a manifold 302, the chamber port assembly 110 may be cleaned in-situ without introducing a separate jig or tooling into the first chamber 102 or the second chamber 106 or by removing any components from the first chamber 102 or the second chamber 106, which could necessitate lengthy recalibrating and/or recertifying the process chamber for production. Moreover, since a cleaning fluid can be introduced without large downtime to the process chamber, the cleaning of the chamber port assembly 110 can be performed more frequently (e.g., periodically between process runs of substrates).

In some embodiments, a purge gas source may be connected to one of the inlet ports 220 to allow a purge gas, such as $N_2$ or other inert gas, to be delivered directly to the tunnel 212 to remove particles from a substrate passing through the chamber port assembly between the first chamber 102 and the second chamber 106.

In some embodiments, and as shown in FIGS. 1 and 3, the substrate processing system 100 may include a controller 112 configured to receive sensor data from at least one sensor (e.g., sensors 310*a*, 310*b*, 310*c*, 310*d*) associated with at least one condition proximate to the tunnel 212 and regulate, based at least on the sensor data, fluid flow through at least one of the plurality of independent inlet ports 220. In some embodiments, sensor 310*a* (particle detector) and/or sensor 310*b* (RGA) may be configured to detect and/or analyze residual gases and particles while purge gas is provided into the chamber port assembly via the manifold 302. In some embodiments, sensor 310*a* (particle detector) and/or sensor 310*b* (RGA) may be configured to detect and/or analyze particles during a purge operation and cleaning operation for accurate closed loop endpoint process chamber purging and cleaning and optimizing cleaning times. In some embodiments, the sensor 310*a* (particle detector) may be configured to detect and count particles during, for example, actuation of the slit valve 214. The count of particles may be used to determine wear and lifespan of the seal 402 on slit valve door 216. In some embodiments, the sensor 310*b* (RGA) may be configured for incoming particle analysis. In some embodiments, the RGA may detect particle type, e.g., seal particle, residue deposit particle. By detecting number and type of particle, the controller 112 may make determinations about seal wear and cleaning status of the chamber port assembly 110. For example, during a cleaning operation, continued detection of residue particle concentration above a threshold value may indicate that the chamber port assembly 110 is not clean and that cleaning should continue, whereas concentration below the threshold may indicate that the chamber port assembly 110 is sufficiently clean and that cleaning should end.

In some embodiments, the controller 112 may include a processor 124 (programmable) that is operable with a memory 126 and a mass storage device, an input control unit, and a display unit (not shown), such as power supplies, clocks, cache, input/output (I/O) circuits, and support circuits 130 coupled to the various components of the processing system to facilitate control of the substrate processing. Support circuits 130 may be coupled to the processor 124 for supporting the processor 124 in a conventional manner.

The processor 124 may be one of any form of general-purpose computer processor that can be used in an industrial setting, such as a programmable logic controller (PLC), for controlling various chambers and sub-processors. The memory 126 coupled to the processor 124 and the memory 126 can be non-transitory computer readable storage medium and may be one or more of readily available memory such as random access memory (RAM), read only memory (ROM), floppy disk drive, hard disk, or any other form of digital storage, local or remote. Fluid flow regulation and other processes described herein are generally stored in the memory 126, typically as software routine. The software routine may also be stored and/or executed by a second processor (not shown) that is remotely located from the substrate processing system 100 being controlled by the processor 124.

The memory 126 may be in the form of computer-readable storage media that contains instructions, which when executed by the processor 124, facilitates the operation of the substrate processing system 100. The instructions in the memory 126 may be in the form of a program product such as a program that implements the method in accordance with embodiments of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative non-transitory computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such non-transitory computer-readable storage media, when carrying computer-readable instructions that direct the functions of the methods described herein, are embodiments of the present disclosure.

In some embodiments, in operation, a purge gas (e.g., $N_2$) may flow through an inlet port 220 and a manifold 302 into the tunnel 212 as a substrate is moving through the tunnel 212. As shown in FIG. 3, the sensor 310*a* (particle detector) and/or sensor 310*b* (RGA) may connect to one or more sensor ports 222 to sense particles proximate the chamber port assembly 110. For example, the purge gas may remove particles from the substrate as the substrate passes through the tunnel 212. The proximity of the sensor ports 222 closer to the substrate and the chamber port assembly 110 can help capture more accurate point of exit residual gas and particle information than sensing particles in the foreline (e.g., in the process chamber exhaust).

In some embodiments, as the slit valve 214 is actuated, particles of the seal 402 may wear away and fall off in the tunnel 212. The sensor 310*a* (particle detector) and/or sensor 310*b* (RGA) may be configured to detect particles of the seal 402 during purge and cleaning processes. In some embodiments, particle emissions from the seal 402 may be correlated (e.g., empirically) to wear and lifespan of the seal so that it may be possible to quantitatively estimate an amount of wear and lifespan of the seal 402 from detecting particle emissions sensed by the sensor 310*b* (RGA) and/or sensor 310*a* (particle detector).

In some embodiments, the image sensor 310*c* may be configured to capture images of a substrate passing through the tunnel 212 of the chamber port assembly 110. Existing methods of substrate placement into a process chamber may use a known technique called Local Center Find (LCF). Any position displacement of the substrate as the substrate exits the process chamber (compared to substrate position entering the process chamber) may be used to indicate problems with the substrate processing recipe and/or components of the process chamber, such as a broken lift pin, or a substrate sliding or otherwise moving on a substrate support (e.g., an electrostatic chuck, susceptor, vacuum chuck, or the like). Images of the substrate captured by the image sensor 310*c* can be used to determine and correct for detected substrate movement.

In some embodiments, the sensor 310*d* (temperature sensor) may be configured to sense a temperature of a substrate surface as it passes through the tunnel 212. In some embodiments, substrate surface temperature can be measured by the temperature sensor 310*d* as the substrate moves in both directions through the tunnel 212, i.e., enters and exits a process chamber. The substrate surface temperature can be used to monitor/correct substrate thermal budgets (which may be particularly relevant for low temp packaging applications). In some embodiments, measurements of the substrate surface temperature before and after the substrate is processed can be used for closed loop recipe changes that impact substrate thermal budget.

Figure 6:
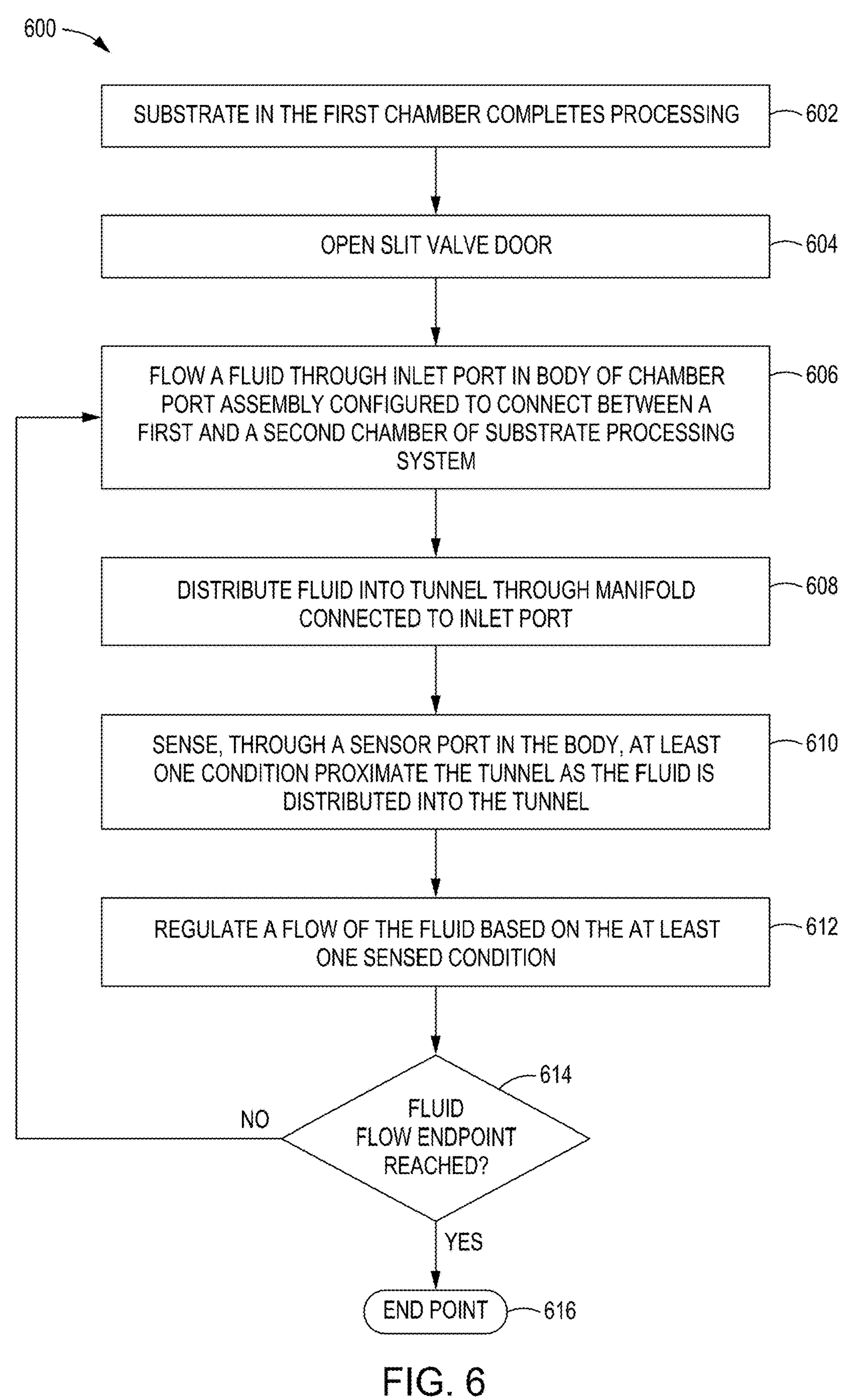
FIG. 6 shows a method for a substrate processing system in accordance with some embodiments of the present disclosure.

FIG. 6 shows a method 600 for a substrate processing system in accordance with some embodiments of the present disclosure. In some embodiments, the substrate processing system is the substrate processing system 100. The method 600 may begin initially at block 602, where a substrate in the first chamber (e.g., first chamber 102) may complete processing (e.g., a deposition process). At block 604, the method 600 may include opening the slit valve door 216 to permit a blade of a transfer robot (not shown) to move from the second chamber (e.g., second chamber 106) to the first chamber through the chamber port assembly (e.g., through the tunnel 212) to pick up and move the substrate from the first chamber through the tunnel to the second chamber.

At block 606, the method 600 may include, as the substrate moves through the tunnel towards the second chamber, flowing a fluid (e.g., purge gas) through an inlet port (e.g., inlet port 220) in a body (e.g., body 202) of a chamber port assembly (e.g., chamber port assembly 110) configured to connect between a first and a second chamber of the substrate processing system. At block 608, the method 600 may include distributing the fluid into the tunnel through a manifold (e.g., manifold 302) connected to the inlet port. The manifold has one or more outlets (e.g., outlets 304) in fluid communication with the tunnel. In some embodiments, the outlets are configured to direct the fluid as a curtain of fluid so that as the substrate passes through the tunnel, the curtain of fluid (e.g., purge gas) may blow particles off the substrate (e.g., into the tunnel).

At block 610, the method 600 may include sensing, through a sensor port in the body, at least one condition proximate the tunnel as the fluid is distributed into the tunnel.

In some embodiments, sensing may include detecting and analyzing residual gases from the substrate passing through the tunnel. In some embodiments, the sensor 310*a* (particle detector) and/or sensor 310*b* (RGA) may be configured to detect and analyze the residual gases as the substrate passes through the tunnel 212. For example, particles blown from the substrate and/or particles of the seal 402 may be detected and analyzed. In some embodiments, the sensor 310*a* (particle detector) and/or sensor 310*b* (RGA) may provide a signal to the controller 112 for closed loop feedback control for regulating the flow of purge gas. For example, sensor 310*b* (RGA) may detect carbon traces for detecting particles of the seal 402 and the controller 112 may compare the carbon traces to a threshold value that may indicate seal end of life. The controller 112 may trigger a notification that the seal 402 is at end of life when the carbon traces are at or above the threshold value.

In some embodiments, sensing may include capturing images (e.g. using the sensor 310*c* (image sensor)) of a substrate as the substrate passes through the tunnel 212. In some embodiments, images of the substrate may be captured (e.g., using sensor 310*c*) as the substrate exits the first chamber through the tunnel 212 of the chamber port assembly 110. In some embodiments, the captured images may be processed (e.g., by the controller 112) and compared to other images captured (e.g., by the sensor 310*c*) when the substrate entered the first chamber to identify movement or displacement of the substrate which can be used for automatic substrate placement correction and/or to alert an operator of potential problems with chamber components.

In some embodiments, sensing may include sensing a temperature (e.g., using the sensor 310*d* (temperature sensor)) of a substrate passing through the tunnel 212. In some embodiments, sensing may include sensing substrate surface temperature (e.g., using sensor 310*d*) as the substrate exits the first chamber through the chamber port assembly 110. In some embodiments, the controller 112 may compare the sensed temperature to the substrate surface temperature previously sensed (e.g., by the sensor 310*d*) when the substrate entered the first chamber through the chamber port assembly 110 for automatic temperature recipe correction. Also, knowledge of the substrate surface temperatures before and after the substrate is processed can allow for closed loop recipe changes that may impact substrate thermal budget.

At block 612, the method 600 may include regulating a flow of the fluid based on the at least one sensed condition. In some embodiments, the conditions sensed by any of the sensors 310*a*, 310*b*, 310*c*, 310*d* may provide feedback to the controller 112, which can control the flow of the fluid based on the feedback. In some embodiments, when flowing a cleaning fluid, the feedback may be used to determine the endpoint of cleaning. In some embodiments, when flowing a cleaning fluid, feedback from the sensor 310*a* (particle detector) and/or sensor 310*b* (RGA) may be used by the controller 112 to determine whether or not a threshold concentration of a gas or a threshold particulate count proximate the tunnel 212 is at or below a threshold value corresponding to a clean condition at which the flow of cleaning fluid may cease to end the cleaning operation.

At block 614, the method may include determining whether a fluid flow endpoint is reached. For example, in some embodiments, once the substrate has moved from the first chamber into the second chamber, the fluid flow endpoint may be reached, the fluid flow may be turned off, and the process may end at block 616. In some embodiments, while flowing a cleaning fluid, the controller 112 may determine that an endpoint of cleaning has been reached at which point flow of cleaning fluid may cease. In some embodiments, if the fluid flow process does not end at block 614, the method may continue to repeat blocks 606-612.

In some embodiments, after the substrate has fully exited the first chamber and is in the second chamber, blocks 606-612 may be repeated by flowing a cleaning fluid (e.g., $NF_3$ plasma) through the inlet port in the body of the chamber port assembly to clean the chamber port assembly. The cleaning fluid (e.g., $NF_3$ plasma) may be introduced through an inlet port (e.g., inlet port 220) and distributed through a manifold (e.g., manifold 302). In some embodiments, the controller 112 may determine an endpoint for flowing cleaning fluid based on feedback from the sensor 310*a* (particle detector) and/or the sensor 310*b* (RGA), as described herein. If the cleaning endpoint has not been reached, cleaning may continue at block 614. If the cleaning endpoint has been reached, the flow of cleaning fluid may end, and the cleaning process may end at block 616. In some embodiments, cleaning may be performed periodically or after a certain number of substrates are processed in the process chamber (i.e., after each substrate is processed).

In some embodiments, the flow of purge gas or cleaning fluid may be performed when the slit valve is closed. In some embodiments, and as shown in FIG. 4, the outlets 304 of the manifold may be located on a backside (right side in FIG. 4) of the slit valve door 216. With the slit valve door 216 closed, cleaning fluid exiting the outlets 304 may clean a portion of the tunnel 212 to the right of the slit valve door and/or the backside of the slit valve door 216. In some embodiments, the outlets 304 of the manifold 302 may alternatively or additionally be located on a front side (left side in FIG. 4) of the slit valve door 216 to permit cleaning of a portion of the tunnel 212 to the left of the slit valve door 216 and a front side of the slit valve door 216.

The systems, apparatus, and methods described herein provide for in-situ fluid delivery and measurement proximate an interface between chambers of a substrate processing system. Specifically, fluid delivery and measurements may be made through the body of a chamber port assembly described herein. The fluid delivery facilitates cleaning of the chamber port assembly and can reduce downtime for cleaning compared to existing methods. The fluid delivery and measurements permit detection of conditions proximate to the chamber port assembly that can be used for preventative maintenance of chamber components and to make corrections to process recipes.

While the foregoing is directed to embodiments of the present disclosure, other and further embodiments of the disclosure may be devised without departing from the basic scope thereof.

The invention claimed is:

1. A chamber port assembly configured to connect between respective first and second chambers of a substrate processing system, the chamber port assembly comprising:
- a body with openings disposed on opposing sides of the body and a tunnel extending between the openings to facilitate passage of a substrate between the first and second chambers through the tunnel;
- an inlet port in the body;
- a manifold in fluid communication with the inlet port and having an outlet in fluid communication with the tunnel;
- a sensor port in the body in communication with the tunnel; and
- a slit valve coupled to the body, the slit valve configured to selectively close the tunnel, the slit valve located in the tunnel between the openings of the body, wherein the slit valve is spaced from the openings of the body.

2. The chamber port assembly of claim 1, further comprising:
- another inlet port in the body; and
- another manifold in fluid communication with the another inlet port and having another outlet in fluid communication with the tunnel.

3. The chamber port assembly of claim 1, further comprising a sensor coupled to the sensor port, the sensor configured to sense at least one condition proximate to the tunnel.

4. The chamber port assembly of claim 3, wherein the sensor is at least one of a residual gas analyzer or a particle detector.

5. The chamber port assembly of claim 3, wherein the sensor is configured to detect and analyze residual gases and particles while purge gas is provided into the chamber port assembly via the manifold.

6. The chamber port assembly of claim 3, wherein the sensor is at least one of a temperature sensor, or an image sensor.

7. The chamber port assembly of claim 1, wherein the outlet of the manifold is configured to direct fluid towards one of the opposing sides of the body.

8. The chamber port assembly of claim 1, wherein the manifold includes a plurality of outlets that are equally spaced.

9. The chamber port assembly of claim 1, wherein the manifold includes a plurality of outlets that are not equally spaced.

10. A substrate processing system, comprising:

a first chamber;

a second chamber; and the chamber port assembly of claim 1 connected between the first chamber and the second chamber.

11. The substrate processing system of claim 10, further comprising a remote plasma source connected to the inlet port of the chamber port assembly.

12. The substrate processing system of claim 10, further comprising a sensor coupled to the sensor port, the sensor configured to sense at least one condition proximate to the tunnel.

13. The substrate processing system of claim 12, further comprising a controller configured to receive sensor data associated with the at least one condition and regulate, based at least on the sensor data, fluid flow through the inlet port.

14. A method for a substrate processing system, the method comprising:

flowing a fluid through an inlet port in a body of a chamber port assembly configured to connect between a first and a second chamber of the substrate processing system, the chamber port assembly comprising:

a body with openings disposed on opposing sides of the body and a tunnel extending between the openings to facilitate passage of a substrate between the first and second chambers through the tunnel; and a slit valve coupled to the body, the slit valve configured to selectively close the tunnel, the slit valve located in the tunnel between the openings of the body, wherein the slit valve is spaced from the openings of the body;

distributing the fluid into the tunnel through a manifold connected to the inlet port, the manifold having an outlet in fluid communication with the tunnel; and sensing, through a sensor port in the body, at least one condition proximate the tunnel as the fluid is distributed into the tunnel.

15. The method of claim 14, wherein the sensing includes detecting and analyzing residual gases and particles from a substrate passing through the tunnel.

16. The method of claim 14, wherein sensing includes capturing images of a substrate as the substrate passes through the tunnel.

17. The method of claim 14, wherein sensing includes sensing a temperature of a substrate passing through the tunnel.

18. The method of claim 14, wherein the fluid includes at least one of a gas or a plasma.

19. The method of claim 14, further comprising regulating a flow of the fluid based on the at least one sensed condition.

* * * * *